United States Patent
Kim et al.

(10) Patent No.: US 9,076,511 B2
(45) Date of Patent: Jul. 7, 2015

(54) NONVOLATILE MEMORY DEVICE AND MEMORY SYSTEM INCLUDING THE SAME

(71) Applicant: Samsung Electronics Co., Ltd., Suwon-si (KR)

(72) Inventors: Taehyun Kim, Seongnam-si (KR); Youngcho Kim, Seoul (KR); Youngsun Min, Hwaseong-si (KR); Sungwhan Seo, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/087,444

(22) Filed: Nov. 22, 2013

(65) Prior Publication Data
US 2014/0233337 A1  Aug. 21, 2014

(30) Foreign Application Priority Data

Feb. 21, 2013  (KR) .................. 10-2013-0018708

(51) Int. Cl.
  *G11C 5/14*  (2006.01)
  *G11C 16/06*  (2006.01)

(52) U.S. Cl.
  CPC .............. *G11C 5/147* (2013.01); *G11C 5/145* (2013.01); *G11C 16/06* (2013.01)

(58) Field of Classification Search
  CPC ....... G11C 15/147; G11C 5/145; G11C 16/06
  USPC ........... 365/226, 185.23, 189.09, 189.11, 227
  See application file for complete search history.

(56) References Cited

U.S. PATENT DOCUMENTS

| | | | | |
|---|---|---|---|---|
| 5,337,284 | A | * | 8/1994 | Cordoba et al. ............... 365/227 |
| 5,535,160 | A | * | 7/1996 | Yamaguchi ............... 365/189.14 |
| 5,801,987 | A | * | 9/1998 | Dinh ......................... 365/185.18 |
| 5,982,222 | A | * | 11/1999 | Kyung .......................... 327/536 |
| 5,999,475 | A | * | 12/1999 | Futatsuya et al. ............. 365/226 |
| 6,590,445 | B2 | | 7/2003 | Ueda |
| 6,975,101 | B1 | | 12/2005 | Marin et al. |
| 7,199,646 | B1 | | 4/2007 | Zupcau et al. |
| 7,426,146 | B2 | | 9/2008 | Aota et al. |
| 7,982,531 | B2 | | 7/2011 | Yoshida et al. |
| 8,026,756 | B2 | | 9/2011 | Yuasa |
| 8,049,483 | B2 | | 11/2011 | Yamamoto et al. |
| 8,373,501 | B2 | | 2/2013 | Suzuki |
| 2005/0057288 | A1 | * | 3/2005 | Senda et al. .................. 327/148 |
| 2006/0152206 | A1 | | 7/2006 | Yu |
| 2009/0231022 | A1 | * | 9/2009 | Kim et al. ..................... 327/536 |

(Continued)

FOREIGN PATENT DOCUMENTS

| | | |
|---|---|---|
| JP | 3136629 | 12/2000 |
| JP | 2004030064 | 1/2004 |
| KR | 100205546 | 4/1999 |

(Continued)

*Primary Examiner* — Tan T. Nguyen
(74) *Attorney, Agent, or Firm* — Onello & Mello, LLP.

(57) ABSTRACT

A nonvolatile memory device includes a memory cell array; and a high voltage generator arranged to generate a high voltage to be supplied to the memory cell array. The high voltage generator includes a pump unit block having a plurality of pump units supplied with an external voltage and at least one of the pumps is engaged in pumping the external voltage to a higher, output, voltage, at a steady clock rate. The number of pumps engaged in pumping is increased until a predetermined period has elapsed. The rate at which the number of pumps is increased depends upon the value of the external voltage.

19 Claims, 16 Drawing Sheets

(56) References Cited

U.S. PATENT DOCUMENTS

2011/0148509 A1* 6/2011 Pan .............................. 327/536
2012/0139621 A1* 6/2012 Kwon .......................... 327/536

FOREIGN PATENT DOCUMENTS

| KR | 100240421 | 10/1999 |
| KR | 100471143 | 2/2005 |

* cited by examiner

US 9,076,511 B2

NONVOLATILE MEMORY DEVICE AND MEMORY SYSTEM INCLUDING THE SAME

CROSS-REFERENCE TO RELATED APPLICATIONS

A claim for priority under 35 U.S.C. §119 is made to Korean Patent Application No. 10-2013-0018708 filed Feb. 21, 2013, in the Korean Intellectual Property Office, the entire contents of which are hereby incorporated by reference.

BACKGROUND

Exemplary embodiments in accordance with principles of inventive concepts relate to a voltage generator, and more particularly, relate to a nonvolatile memory device including a high voltage generator circuit and a memory system including the same.

A semiconductor memory device may operate using a voltage provided from an external device, which may be referred to herein as an external voltage. Generally, a semiconductor memory device requires a stable voltage regardless of any variation in an external voltage. For this reason, the semiconductor memory device may generate an internal voltage using the external voltage and perform internal operations based on the internal voltage. However, conversion of the external voltage into the internal voltage may reduce power efficiency.

SUMMARY

In exemplary embodiments in accordance with principles of inventive concepts, a nonvolatile memory device includes a memory cell array; and a high voltage generator arranged to generate a high voltage to be supplied to the memory cell array, wherein the high voltage generator includes: a pump unit block having a plurality of pump units supplied with an external voltage; a voltage increment control block arranged to generate a voltage increment code varied according to a fixed clock signal generated using an internal voltage; a regulator arranged to determine whether an output voltage of the pump unit block reaches a target level, based on the voltage increment code; and a final stage decision block arranged to generate a pump unit selection code varied according to a variable clock signal generated using the external voltage, wherein the number of pump units, used to generate the high voltage, from among the plurality of pump units is determined by the pump unit selection code.

In exemplary embodiments in accordance with principles of inventive concepts, a regulator comprises: a voltage divider arranged to divide an output voltage of the pump unit block according to the voltage increment code, the divided voltage being constantly varied according to the voltage increment code; a comparator arranged to compare the divided voltage of the voltage divider and a reference voltage; and a logic gate arranged to supply a pump clock signal to the pump unit block according to the comparison result of the comparator.

In exemplary embodiments in accordance with principles of inventive concepts, a voltage increment block comprises: a fixed clock generator arranged to generate the fixed clock signal having a period determined according to the internal voltage; and a code generator arranged to count the fixed clock signal to generate the voltage increment code, the code generator activating a count end signal when the count value reaches a particular value.

In exemplary embodiments in accordance with principles of inventive concepts, a final stage decision block comprises: a variable block generator arranged to generate the variable clock signal having a period determined according to the external voltage; and a pump unit selection code generator arranged to count the variable clock signal to generate the pump unit selection code, counting of the pump unit selection code generator being terminated in response to an activation of the count end signal.

In exemplary embodiments in accordance with principles of inventive concepts, the number of pump units, used to generate the high voltage, from among the plurality of pump units is determined by a pump unit selection code finally generated by the pump unit selection code generator at an activation of the count end signal.

In exemplary embodiments in accordance with principles of inventive concepts, a fixed clock generator and the variable clock generator are disabled at the activation of the count end signal.

In exemplary embodiments in accordance with principles of inventive concepts, a pump unit block comprises: clock switches respectively corresponding to the plurality of pump units and sequentially activated by the pump unit selection code so as to supply the pump clock to corresponding pump units; and voltage switches respectively corresponding to the plurality of pump units and sequentially inactivated by the pump unit selection code so as to block the pump clock supplied to corresponding pump units.

In exemplary embodiments in accordance with principles of inventive concepts, a voltage switch, corresponding to a final pump unit, from among the pump units is arranged to supply the external voltage to the corresponding pump unit regardless of the pump unit selection code.

In exemplary embodiments in accordance with principles of inventive concepts, a memory system includes a nonvolatile memory device; and a memory controller arranged to control the nonvolatile memory device, wherein the nonvolatile memory device comprises a high voltage generator including: a pump unit block having a plurality of pump units supplied with an external voltage; a voltage increment control block arranged to generate a voltage increment code varied according to a fixed clock signal generated using an internal voltage; a regulator arranged to determine whether an output voltage of the pump unit block reaches a target level, based on the voltage increment code; and a final stage decision block arranged to generate a pump unit selection code varied according to a variable clock signal generated using the external voltage, wherein the number of pump units, used to generate the high voltage, from among the plurality of pump units is determined by the pump unit selection code.

In exemplary embodiments in accordance with principles of inventive concepts, an external voltage is provided from the memory controller or from an external device of the memory controller.

In exemplary embodiments in accordance with principles of inventive concepts, a method of operating a nonvolatile memory device which includes a high voltage generator having a plurality of pump units serially connected, includes: generating a first clock signal having a fixed period using an internal voltage and a second clock signal having a variable period using an external voltage; counting the second clock signal to generate a pump unit selection code for deciding the number of pump units of the high voltage generator participating in generation of a high voltage; and generating a count end signal when a count value of the first clock signal reaches a particular value, wherein counting of the second clock signal is ended by an activation of the count end signal.

In exemplary embodiments in accordance with principles of inventive concepts, the number of pump units of the high voltage generator participating in generation of the high voltage is determined by a pump unit selection code finally generated at an activation of the count end signal.

In exemplary embodiments in accordance with principles of inventive concepts, counting of the first clock signal and counting of the second clock signal are disabled at the activation of the count end signal.

In exemplary embodiments in accordance with principles of inventive concepts, the external voltage is supplied from a memory controller controlling the nonvolatile memory device.

In exemplary embodiments in accordance with principles of inventive concepts, the external voltage is supplied from the outside of a memory controller controlling the nonvolatile memory device.

In exemplary embodiments in accordance with principles of inventive concepts, a method of supplying a high voltage to a nonvolatile memory device, includes: engaging a pump from a sequentially-connected group of pumps to pump a pumping voltage to a higher level output voltage; pumping a higher voltage output at a steady clock rate; and increasing the number of pumps engaged in pumping action until a predetermined period has elapsed.

In exemplary embodiments in accordance with principles of inventive concepts, the number of pumps engaged in pumping action is increased at a rate dependent upon the value of the pumping voltage.

In exemplary embodiments in accordance with principles of inventive concepts, the number of pumps engaged in pumping action is increased at a greater rate for a lower value of pumping voltage.

In exemplary embodiments in accordance with principles of inventive concepts, the pumps pump an output voltage for accessing a memory device.

In exemplary embodiments in accordance with principles of inventive concepts, the pumps pump an output voltage for accessing a memory device in a portable electronic device.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
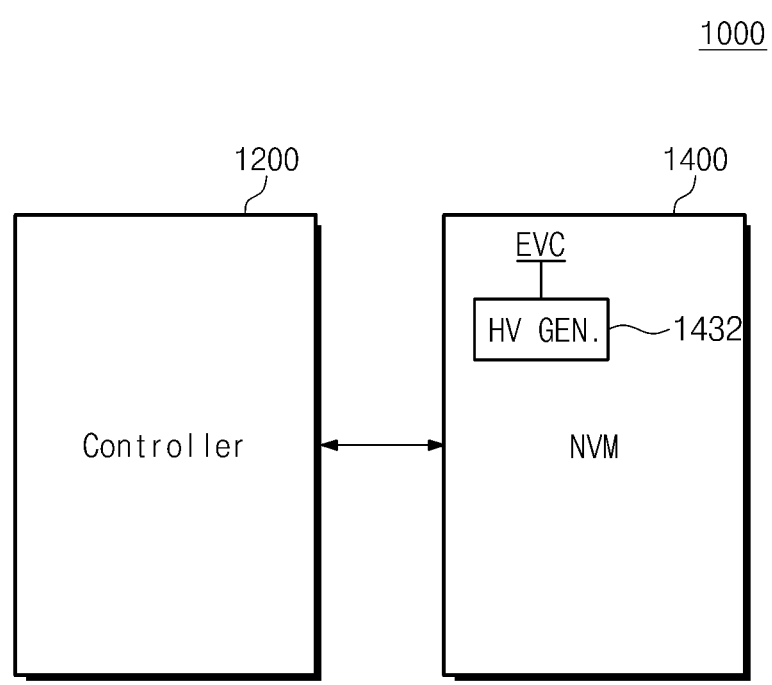
FIG. 1 is a block diagram schematically illustrating a memory system according to an exemplary embodiment in accordance with principles of inventive concepts.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough, and will convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. The term "or" is used in an inclusive sense unless otherwise indicated.

It will be understood that, although the terms first, second, third, for example. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments in accordance with principles of inventive concepts will be explained in detail with reference to the accompanying drawings.

FIG. 1 is a block diagram schematically illustrating an exemplary embodiment of a memory system in accordance with principles of inventive concepts. Memory system 1000 may include a memory controller 1200 and a nonvolatile memory device 1400, such as a multi-bit/multi-level memory device, for example. The memory controller 1200 may be arranged to control the nonvolatile memory device 1400 according to an external request (for example, a write request, a read request, etc.). Additionally, the memory controller 1200 may be arranged to control the nonvolatile memory device 1400 according to an internal request (for example, an operation associated with sudden power-off, a wear-leveling operation, a read reclaim operation, etc.) without an external request. An operation corresponding to an internal request of the memory controller 1200 may be executed within a timeout period of a host after a host request is processed, for example. Alternatively, an operation corresponding to an internal request of the memory controller 1200 may be executed within an idle time of the memory controller 1200.

The nonvolatile memory device 1400 may operate responsive to the control of the memory controller 1200, and may be used as a type of storage medium that stores data information. The storage medium may be formed of one or more memory chips. The nonvolatile memory device 1400 may communicate with the memory controller 1200 via one or more channels and may include a NAND flash memory device, for example.

As illustrated in FIG. 1, the nonvolatile memory device 1400 may include a high voltage generator 1432. The high voltage generator 1432 may receive an external voltage EVC (which will also be referred to herein as the pump input voltage) from which it generates a higher voltage (hereinafter, referred to as a high voltage, or pump output voltage). The high voltage generator 1432 may generate a stable high voltage, regardless of a variation of the external device EVC. The high voltage generator 1432 may generate the high voltage using the external voltage EVC directly provided from an external device, not an internal voltage generated by an internal voltage generator (not shown). However, exemplary embodiments in accordance with principles of inventive concepts are not limited thereto, as will be more fully described later.

In exemplary embodiments in accordance with principles of inventive concepts, the external voltage EVC may be a voltage supplied from the memory controller 1200 or the external device EVC may be a voltage supplied from a host (not shown), for example. The range of the external voltage EVC is not limited to a particular voltage range.

In exemplary embodiments in accordance with principles of inventive concept, the memory controller 1200 and the nonvolatile memory device 1400 may form a multi-media card (MMC) or an embedded MMC (eMMC) directly mounted on a board of a handheld electronic device. Alternatively, the memory controller 1200 and the nonvolatile memory device 1400 may form a solid state drive (SSD).

Figure 2:
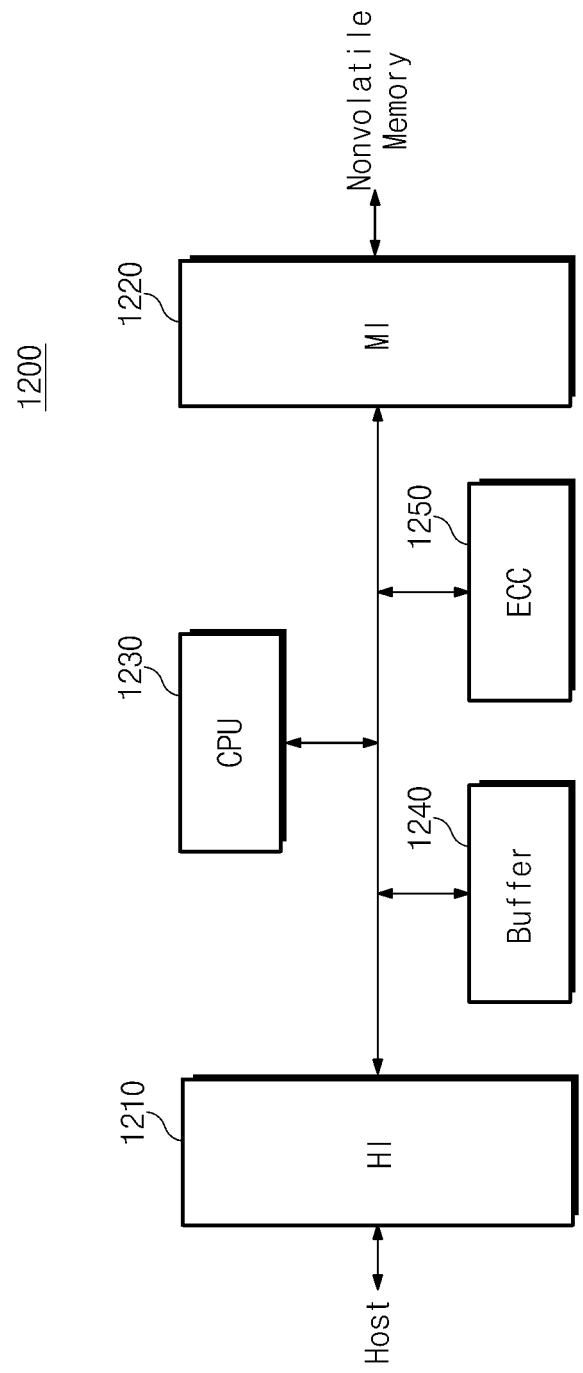
FIG. 2 is a block diagram schematically illustrating a memory controller in FIG. 1.

FIG. 2 is a block diagram schematically illustrating an exemplary embodiment in accordance with principles of inventive concepts of a memory controller 1200 such as that in FIG. 1. Memory controller 1200 may include a host interface 1210 as a first interface, a memory interface 1220 as a second interface, a CPU 1230, a buffer memory 1240, and an error detecting and correcting (ECC) circuit 1250.

The host interface 1210 may be arranged to interface with an external device (for example, a host), and the memory interface 1220 may be arranged to interface with a nonvolatile memory device, such as memory device 1400 illustrated in FIG. 1. The CPU 1230 may be arranged to control overall operation of the controller 1200. The CPU 1230 may be arranged to operate firmware such as Flash Translation Layer (FTL), for example. The FTL may perform a variety of functions. For example, the FTL may include a variety of layers performing an address mapping operation, a read reclaim operation, an error correction operation, and so on.

The buffer memory 1240 may be used to temporarily store data to be transferred from an external device via the host interface 1210 or data to be transferred from the nonvolatile memory device 1400 via the memory interface 1220. The buffer memory 1240 may be used to store information (for example, address mapping information, etc.) necessary to control the nonvolatile memory device 1400. The buffer memory 1240 may be formed of DRAM, SRAM, or a combination of DRAM and SRAM, for example. However, inventive concepts are not limited thereto. The ECC circuit 1250 may be arranged to encode data to be stored in the nonvolatile memory device 1400 and to decode data read out from the nonvolatile memory device 1400.

Although not illustrated in the figures, the memory controller 1200 may further include a randomizer/de-randomizer which is arranged to randomize data to be stored in the nonvolatile memory device 1400 and to de-randomize data read from the nonvolatile memory device 1400. An example of the randomizer/de-randomizer is disclosed in U.S. Patent Publication No. 2010/0088574, the entire contents of which are hereby incorporated by reference.

In exemplary embodiments in accordance with principles of inventive concepts, the host interface 1210 may be formed according to one of computer bus standards, storage bus standards, and iFCPPeripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, and the like. The storage bus standards may include ST-506, ESDI, SMD, Parallel ATA, DMA, SSA, HIPPI, USB MSC, FireWire (1394), Serial ATA, eSATA, SCSI, Parallel SCSI, Serial Attached SCSI, Fibre Channel, iSCSI, SAS, RapidIO, FCIP, etc. The iFCPPeripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, and the like.

Figure 3:
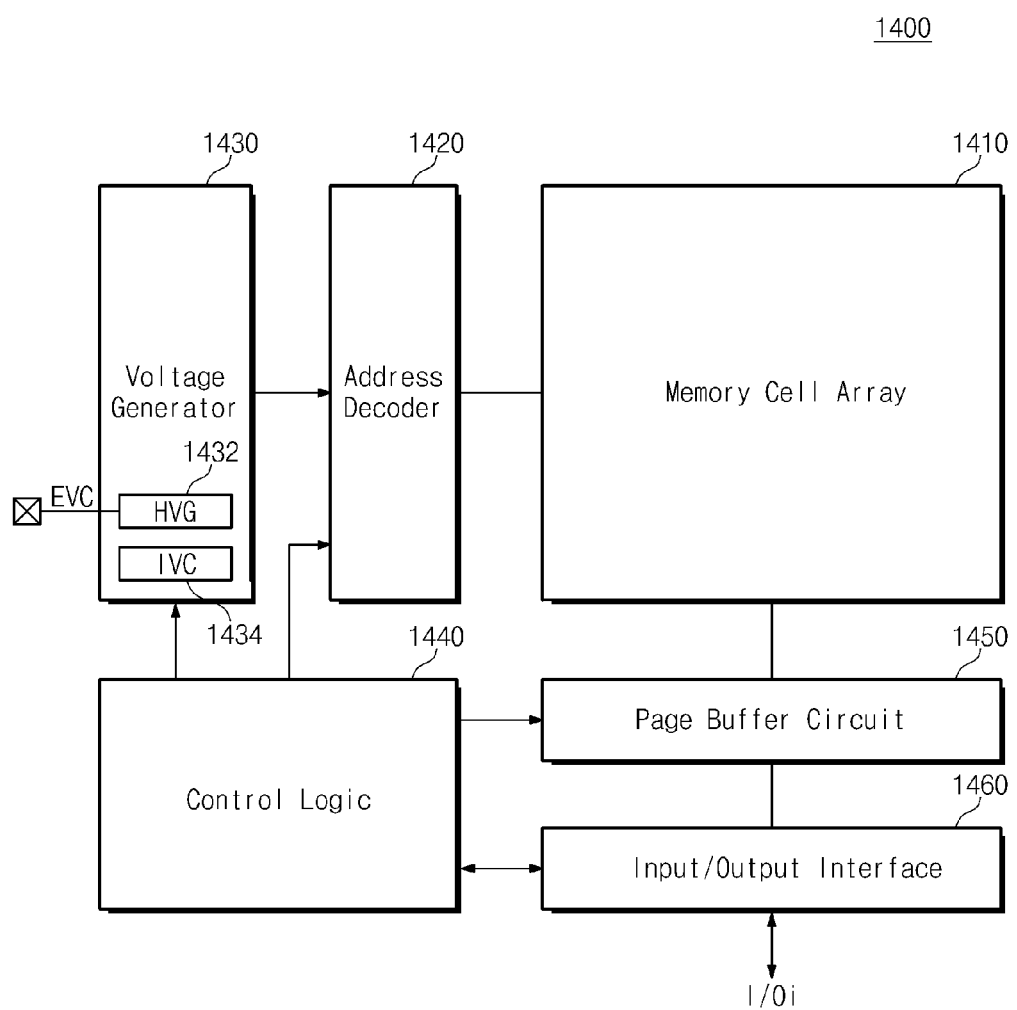
FIG. 3 is a block diagram schematically illustrating a nonvolatile memory device in FIG. 1.

FIG. 3 is a block diagram schematically illustrating an exemplary embodiment of a nonvolatile memory device such as nonvolatile memory device 1400 in FIG. 1. Nonvolatile memory device 1400 may be a NAND flash memory device, for example. However, nonvolatile memory device 1400 is not limited to the NAND flash memory device. For example, the inventive concept may be applied to a NOR flash memory device, a Resistive Random Access Memory (RRAM) device, a Phase-Change Memory (PRAM) device, a Magnetoresistive Random Access Memory (MRAM) device, a Ferroelectric Random Access Memory (FRAM) device, a Spin Transfer Torque Random Access Memory (STT-RAM), and the like. Further, the nonvolatile memory device 1400 can be implemented to have a three-dimensional array structure. A nonvolatile memory device with the three-dimensional array structure may be referred to as a vertical NAND flash memory device. The inventive concept may be applied to a Charge Trap Flash (CTF) memory device including a charge storage layer formed of an insulation film as well as a flash memory device including a charge storage layer formed of a conductive floating gate. Nonvolatile memory device 1400 may include a memory cell array 1410, an address decoder 1420, a voltage generator circuit 1430, control logic 1440, a page buffer circuit 1450, and an input/output interface 1460.

The memory cell array 1410 may include memory cells arranged at intersections of rows (for example, word lines) and columns (for example, bit lines). Each memory cell may store 1-bit data or M-bit data as multi-bit data (M being an integer of 2 or more). The address decoder 1420 may be controlled by the control logic 1440, and may perform selecting and driving operations on rows (for example, word lines, a string selection line(s), a ground selection line(s), a common source line, etc.) of the memory cell array 1410. The control logic 1440 may be arranged to control an overall operation of the nonvolatile memory device 1400.

The page buffer circuit 1450 may be controlled by the control logic 1440, and may be arranged to read data from the memory cell array 1410 and to drive columns (for example, bit lines) of the memory cell array 1410 according to program data. The page buffer circuit 1450 may include page buffers respectively corresponding to bit lines or bit line pairs. Each of the page buffers may include a plurality of latches. The input/output interface 1460 may be controlled by the control logic 1440, and may interface with an external device (for example, a memory controller 1200 in FIG. 1). Although not illustrated in FIG. 3, the input/output interface 1460 may include a column decoder arranged to select page buffers of the page buffer circuit 1450 by a predetermined unit, an input buffer receiving data, an output buffer outputting data, and so on.

The voltage generator circuit 1430 may be controlled by the control logic 1440, and may generate voltages required for each operation, such as a high voltage, a program voltage, a read voltage, a verification voltage, an erase voltage, a pass voltage, a bulk voltage, and the like. Voltages generated by the voltage generator circuit 1430 may be provided to the memory cell array 1410 via the address decoder 1420. The voltage generator circuit 1430 may include a high voltage generator 1432. The high voltage generator 1432 may be directly supplied with an external voltage EVC provided from an external device (for example, a memory controller, a host, etc.). The high voltage generator 1432 may receive the external voltage EVC and generate from it a voltage (hereinafter, referred to as a high voltage) higher than the external voltage EVC. Exemplary embodiments of a high voltage generator 1432 in accordance with principles of inventive concepts will be more fully described with reference to FIGS. 4 and 5. The voltage generator circuit 1430 may further comprises an internal voltage generator 1434. The internal voltage generator 1434 may generate a stable internal voltage based on a voltage provided from the external device (for example, the memory controller, the host, etc.). In exemplary embodiments in accordance with principles of inventive concepts, a voltage which is provided from the external device to the high voltage generator 1432 may be equal to or different from a voltage provided to the internal voltage generator 1434.

Figure 4:
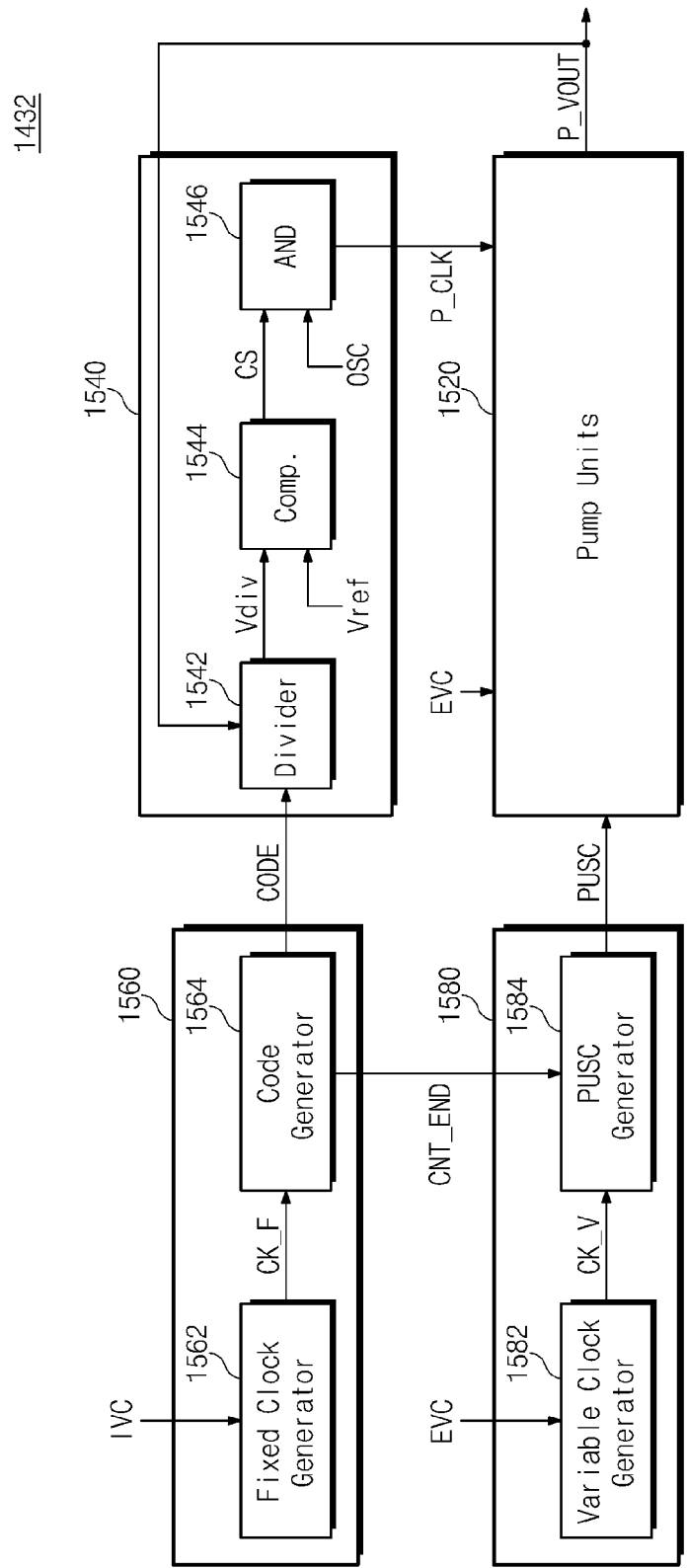
FIG. 4 is a block diagram schematically illustrating a high voltage generator according to an exemplary embodiment in accordance with principles of inventive concepts.

FIG. 4 is a block diagram schematically illustrating an exemplary embodiment in accordance with principles of inventive concepts of a high voltage generator. High voltage generator 1432 may include a pump unit block 1520, a regulator 1540, a voltage increment control block 1560, and a final stage decision block 1580, for example.

In exemplary embodiments in accordance with principles of inventive concepts, one or more pumps, which may be charge pumps, from a plurality of pumps (for example, pumps in pump block unit 1520) are activated to pump a pumping voltage EVC to a higher level output voltage P_VOUT. Pumping activity is paced at a steady rate by a fixed-frequency oscillator for a predetermined period of time, during which the pumped output voltage P_VOUT steadily increases. Pumps are added to the pumping activity at a rate determined by the value of the pumping voltage EVC, with a higher value of EVC adding pumps at a slower rate than a lower value of EVC. When a predetermined period has passed, pumping ceases. The number of pumps ultimately engaged in the pumping activity is determined by the value of EVC. In exemplary embodiments in accordance with principles of inventive concepts, a lower value of EVC engages more pumps and a higher value of EVC engages fewer pumps because pumps are activated, in sequence, more rapidly in response to a lower value of EVC and, when a predetermined pumping period elapses more pumps may have been engaged in a lower value EVC situation.

Figure 5:
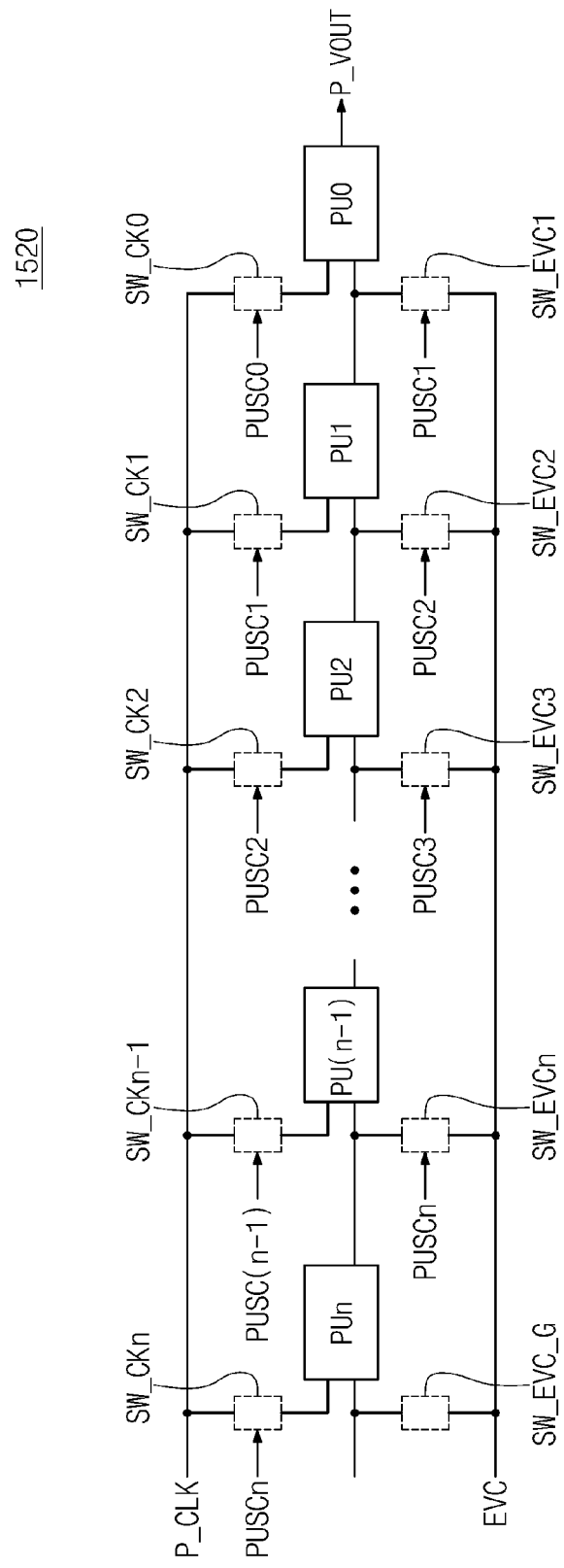
FIG. 5 is a block diagram schematically illustrating a pump unit block 1520 illustrated in FIG. 4.

In exemplary embodiments in accordance with principles of inventive concepts, pump unit block 1520 may be arranged to boost an external voltage EVC in response to a pump clock P_CLK provided from the regulator 1540. A voltage P_VOUT boosted by the pump unit block 1520 may be provided to the regulator 1540. The pump unit block 1520 may be formed of a plurality of pump units serially connected as illustrated in FIG. 5, for example. The regulator 1540 may be arranged to determine whether the output voltage P_VOUT of the pump unit block 1520 reaches (that is, in exemplary embodiments, is at or above) a target voltage level. If the output voltage P_VOUT is determined not to reach the target level, the regulator 1540 may provide the pump unit block 1520 with the pump clock P_CLK. If the output voltage P_VOUT is determined to reach the target level, the regulator 1540 may block the pump clock P_CLK provided to the pump unit block 1520.

The regulator 1540 may include a voltage divider 1542, a comparator 1544, and a AND gate 1546. The voltage divider 1542 may be arranged to divide the output voltage P_VOUT in response to a code value CODE provided from the voltage increment control block 1560. A voltage (hereinafter, referred to as a division voltage) divided by the voltage divider 1542 may stepwise increase according to the code value CODE. However, inventive concepts are not limited thereto. For example, the voltage divider 1542 may be arranged such that the division voltage stepwise decreases according to the code value CODE. The comparator 1544 may compare the division voltage Vdiv and a reference voltage Vref to output a comparison signal CS indicting whether the division voltage Vdiv reaches the reference voltage Vref. For example, in the event that the division voltage Vdiv does not reach the reference voltage Vref, the comparator 1544 may output the comparison signal CS having a high level. In the event that the division voltage Vdiv reaches the reference voltage Vref, the comparator 1544 may output the comparison signal CS having a low level. The AND gate 1546 may output an oscillation signal as the pump clock P_CLK according to the comparison signal. That is, when the comparison signal CS has a high level, the pump clock P_CLK may be provided to the pump unit block 1520 and when the comparison signal CS has a low level, the pump clock P_CLK provided to the pump unit block 1520 may be blocked.

The voltage increment control block 1560 may generate the code value CODE using an internal voltage IVC, and may include a fixed clock generator 1562 and a code generator 1564. The fixed clock generator 1562 may be a voltage controlled oscillator which generates a clock having a period controlled by an input voltage, for example. An internal voltage IVC may be provided to the fixed clock generator 1562 as the input voltage that controls the period/frequency of the voltage controlled oscillator. Because, in an exemplary embodiment, the internal voltage IVC has a fixed level, a clock signal CK_F (hereinafter, referred to as a fixed clock signal) generated by the fixed clock generator 1562 may have a constant period. The code generator 1564 may count the fixed clock signal CK_F to generate the code value CODE as the count result. The code generator 1564 may generate a count end signal CNT_END when the count value reaches a particular value. For example, the fixed clock generator 1562, or output therefrom, may be disabled when the count end signal CNT_END is generated or activated.

Because the code value CODE is generated using the fixed clock signal CK_F having a constant period, division voltage Vdiv may increase at a constant rate. That is, in exemplary embodiments in accordance with principles of inventive concepts, the code value CODE may change every period of fixed clock signal CK_F, so that the division voltage Vdiv increments (increases, in an exemplary embodiment) every clock period.

The final stage decision block 1580 may generate a pump unit selection code PUSC using the external voltage EVC, and may include a variable clock generator 1582 and a pump unit selection code generator 1584. The variable clock generator 1582 may be a voltage controlled oscillator which generates a clock having a period determined by input voltage EVC. Because, in exemplary embodiments in accordance with principles of inventive concepts, external voltage EVC is variable, the period of clock signal CK_V (hereinafter, referred to as a variable clock signal) generated by the variable clock generator 1582 may be variable according to the external voltage EVC. The pump unit selection code generator 1584 may count the variable clock signal CK_V to generate the pump unit selection code PUSC according to the count result. In exemplary embodiments in accordance with principles of inventive concepts, count operation of the pump unit selection code generator 1584 may be ended when the count end signal CNT_END is activated by code generator 1564 and, the pump unit selection code PUSC generated at the time CNT_END is generated may be maintained. In exemplary embodiments in accordance with principles of inventive concepts, variable clock generator 1582 may be disabled when the count end signal CNT_END is activated or generated, for example.

In exemplary embodiments in accordance with principles of inventive concepts, the pump unit selection code PUSC may be used to determine the number of pump units in the pump unit block 1520 participating in generation of the output voltage P_VOUT. The number of pump units in the pump unit block 1520 participating in generation of the output voltage P_VOUT may be adjusted according to the value of the pump unit selection code PUSC and, because the pump unit selection code PUSC is generated using the variable clock signal CK_V having a variable period, the number of pump units in the pump unit block 1520 participating in generation of the output voltage P_VOUT may be changed according to the external voltage EVC. This aspect of exemplary embodiments in accordance with principles of inventive concepts will be described in greater detail below.

In exemplary embodiments in accordance with principles of inventive concepts, the value of external voltage EVC may not be limited to a particular range. To operate over a wide voltage range of the external voltage EVC, for example, a voltage range may be divided into a plurality of different voltage domains, for example. In such exemplary embodiments in accordance with principles of inventive concepts, the final stage decision block 1580 may include a plurality of variable clock generators respectively corresponding to different voltage domains, and may select one of the variable clock generators according to a signal indicating which voltage domain the external voltage EVC is associated with and a variable clock signal may be generated using a variable clock generator associated with the voltage domain with which the external voltage EVC is associated.

FIG. 5 is a block diagram schematically illustrating an exemplary embodiment of a pump unit block in accordance with principles of inventive concepts, such as pump unit block 1520 illustrated in FIG. 4. Pump unit block 1520 may include a plurality of pump units PU0 to PUn and a plurality of switches SW_CK0 to SW_CKn, and SW_EVC1 to SW_EVCn, and SW_EVC_G. The switches SW_CK0 to SW_CKn may correspond to the pump units PU0 to PUn, respectively. The switches SW_CK0 to SW_CKn may supply a pump clock P_CLK to corresponding pump units PU0 to PUn in response to pump unit selection code values PUSC0 to PUSCn. In exemplary embodiments in accordance with principles of inventive concepts, each of the switches SW_CK0 to SW_CKn may be formed of a NAND gate, for example. In such exemplary embodiments, when a corresponding pump unit code value is "1", a switch may supply a corresponding pump clock P_CLK to a corresponding pump unit. In accordance with principles of inventive concepts switches SW_CK0 to SW_CKn may employ other configurations than those employing a NAND gate. Each of the pump units PU0 to PUn may perform a pumping operation in response to the pump clock P_CLK.

The switches SW_EVC1 to SW_EVCn may correspond to the pump units PU0 to PUn−1, respectively. The switches SW_EVC1 to SW_EVCn may supply an external voltage EVC to corresponding pump units PU0 to PUn−1 according to pump unit selection code values PUSC1 to PUSCn. The switch SW_EVC_G may be arranged so that the external voltage EVC is always supplied to a corresponding pump unit Pun, for example. Each of SW_EVC1 to SW_EVCn and SW_EVC_G may be formed of a high voltage blocking transistor and a PMOS transistor controlled by a corresponding pump unit selection code value, for example, with the PMOS and NMOS transistors being connected in series between a corresponding pump unit and the external voltage EVC. However, inventive concepts are not limited to examples where each of the switches SW_EVC1 to SW_EVCn and SW_EVC_G is formed of a high voltage blocking transistor and a PMOS transistor.

In exemplary embodiments in accordance with principles of inventive concepts, pump unit selection code values PUSC0 to PUSCn may be sequentially varied from "0" to "1" starting from an LSB code value PUSC0 whenever a variable clock signal CK_V is pulsed. For example, assuming that the pump unit selection code PUSC is a 5-bit code, the pump unit selection code values PUSC0 to PUSCn may be varied in such an order as "10000", "11000", "11100", "11110", and "11111".

Operation of a high voltage generator in accordance with principles of inventive concepts will be more fully described with reference to accompanying drawings. The high voltage generator 1432 may be a circuit to generate a program voltage (also referred to herein as a programming voltage), for example. In such exemplary embodiments, the high voltage generator 1432 may be activated during a period (for example, a program execution period) where the program voltage is required, for example. However, inventive concepts are not limited thereto. In exemplary embodiments in accordance with principles of inventive concepts, once the high voltage generator 1432 is activated, the fixed clock generator 1562 may generate the fixed clock signal CK_F using the internal voltage IVC, and the code generator 1564 may count the fixed clock signal CK_F to generate the code CODE. As described above, in accordance with principles of inventive concepts, a code value generated using the fixed clock signal CK_F may be varied at a constant rate (that is, changed in constant speed or, every constant time). In exemplary embodiments in accordance with principles of inventive concepts, regulator 1540 may employ the code CODE to determine whether the output voltage P_VOUT of the pump unit block 1520 reaches a target level and may supply the pump clock P_CLK to the pump unit block 1520 according to that determination.

In exemplary embodiments in accordance with principles of inventive concepts, when the high voltage generator 1432 is activated, the variable clock generator 1582 may generate the variable clock signal CK_V using the external voltage EVC. The pump unit selection code generator 1584 may count the variable clock signal CK_V to generate the pump unit selection code PUSC. As described above, in exemplary embodiments in accordance with principles of inventive concepts, pump unit selection code values PUSC0 to PUSCn may be sequentially varied from "0" to "1" starting from an LSB code value PUSC0 whenever the variable clock signal CK_V is pulsed.

In exemplary embodiments in accordance with principles of inventive concepts, during a first period of the variable clock signal CK_V, the LSB code value of the pump unit selection code values PUSC0 to PUSCn may have a value "1". In this case, the pump clock P_CK may be supplied to the pump unit PU0 through the switch SW_CK0. Because the remaining code values, PUSC1 to PUSCn, have a value of "0", the external voltage EVC may be supplied to the pump units PU0 to PUn. As previously described, in accordance with principles of inventive concepts, a pump unit may perform a pumping operation in response to the pump clock P_CLK and, because only the pump unit PU0 is supplied with the pump clock P_CLK through the switch SW_CK0, only pump unit PU0 may operate in this first period.

In exemplary embodiments in accordance with principles of inventive concepts, during a second period of the variable clock signal CK_V, two lower code values of the pump unit selection code values PUSC0 to PUSCn may have a value "1". In this case, the pump clock P_CK may be supplied to the pump units PU0 and PU1 through the switches SW_CK0 and SW_CK1. At this time, because the lower code value PUSC1 is changed from "0" to "1", the switch SW_EVC1 may be disabled. Additionally, because the remaining code values PUSC2 to PUSCn have a value of "0", the external voltage EVC may be supplied to the pump units PU1 to PUn. However, only the pump units PU0 and PU1 supplied with the pump clock P_CLK through the switches SW_CK0 and SW_CK1 are engaged, or activated. In this manner, the pump unit selection code values PUSC0 to PUSCn are sequentially changed according to the count of the variable clock signal CK_V and, as a result, the number of pump units, supplied with the pump clock P_CLK from among the pump units PU1 to Pun, may increase.

In exemplary embodiments in accordance with principles of inventive concepts, while the number of pump units engaged increases (that is, the number supplied with the pump clock P_CLK, from among the pump units PU1 to PUn increases), the regulator 1540 may determine whether the output voltage P_VOUT of the pump unit block 1520 reaches a target voltage. If the count value of the fixed clock signal CK_F reaches a predetermined value, the code generator 1564 may activate the count end signal CNT_END. When the count end signal CNT_END is activated, the count operation of the pump unit selection code generator 1584 is terminated and a pump unit selection code PUSC will be maintained, thereby fixing the number of pump units engaged in generating the output voltage P_VOUT. That is, in accordance with principles of inventive concepts, the number of pumps engaged in generating the output voltage P_VOUT may be determined by the pump unit selection code PUSC (that is, the value of PUSC when CNT_END is activated) and, ultimately by the value of pumping voltage EVC.

In exemplary embodiments in accordance with principles of inventive concepts, the fixed clock signal CK_F having a fixed/constant period may be generated using the internal voltage IVC fixed, and the fixed clock signal CK_F may be used to determine whether the output voltage P_VOUT reaches the target level. The variable clock signal CK_V having a variable period may be generated using the external voltage EVC variable. The variable clock signal CK_V may be used to decide the number of pump units joining in generating the output voltage P_VOUT. The number of pump units may be varied according to the external voltage EVC by deciding the number of pump units according to the variable clock signal CK_V generated using the external voltage EVC variable.

Figure 6:
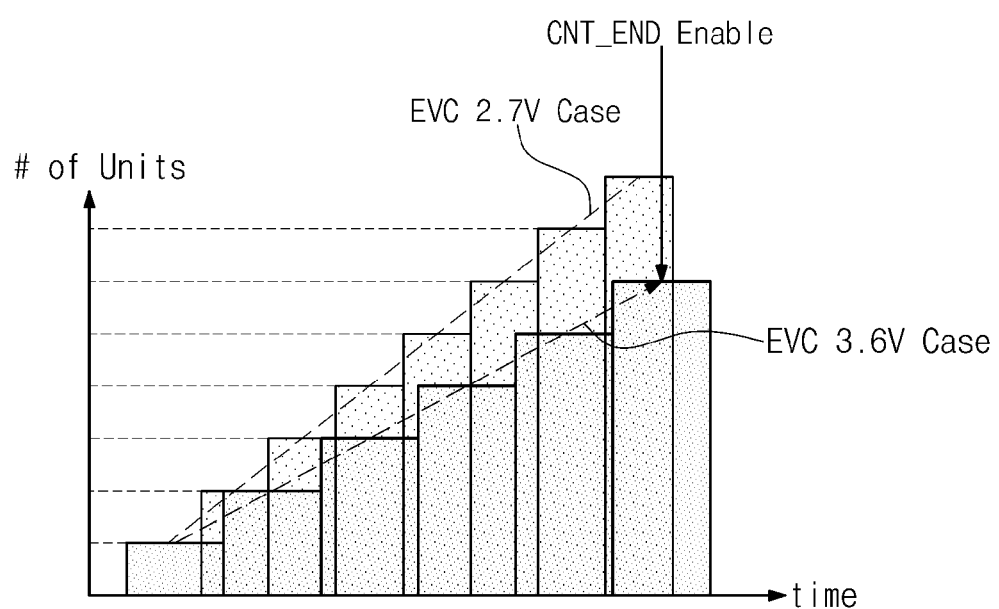
FIG. 6 is a diagram showing relationship between a variation in an external voltage and the number of pump units selected.

FIG. 6 is a diagram showing relationship between a variation in an external voltage and the number of pump units selected in an exemplary embodiment in accordance with principles of inventive concepts. The number of pump units participating in generation of an output voltage P_VOUT may be varied according to an external voltage EVC. In the exemplary embodiment in accordance with principles of inventive concepts of FIG. 6, in the event that the external voltage EVC is 2.7V, eight pump units may be selected on the basis of a point of time when a count end signal CNT_END is activated. In the event that the external voltage EVC is 3.6V, six pump units may be selected on the basis of a point of time when the count end signal CNT_END is activated.

Figure 7:
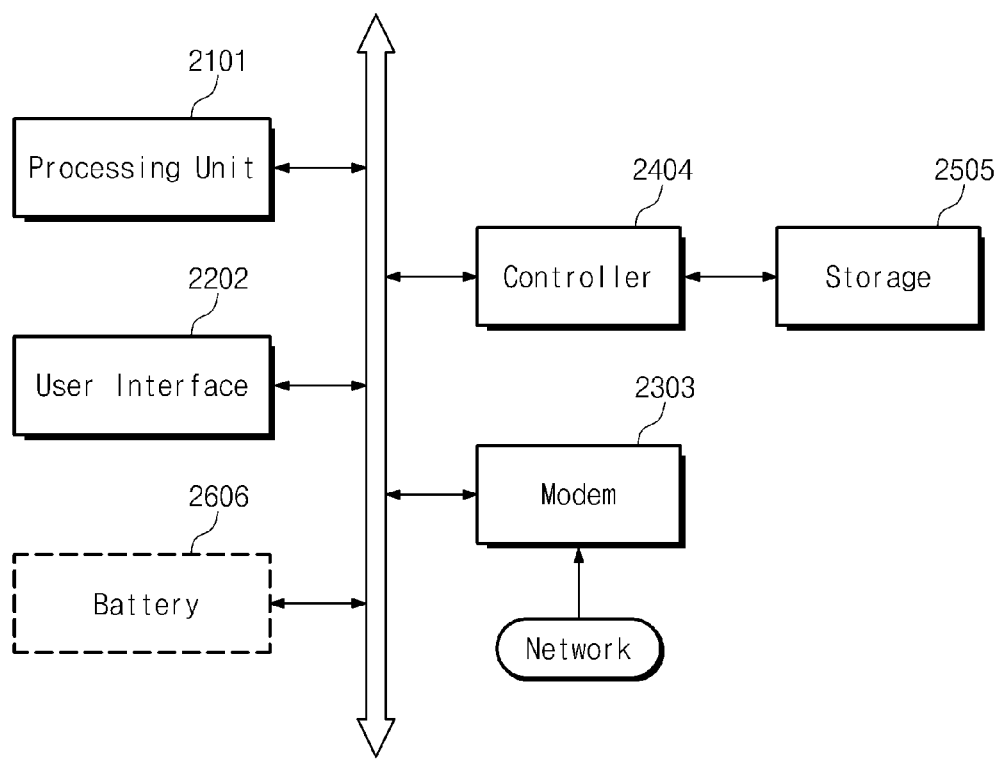
FIG. 7 is a block diagram schematically illustrating a computing system according to an exemplary embodiment in accordance with principles of inventive concepts.

FIG. 7 is a block diagram schematically illustrating a computing system according to an exemplary embodiment in accordance with principles of inventive concepts. A computing system may include a processing unit 2101, a user interface 2202, a modem 2303 such as a baseband chipset, a memory controller 2404, and storage medium 2505.

The memory controller 2404 may be arranged substantially the same as that described in FIG. 2, and the storage medium 2505 may be formed of a nonvolatile memory device of FIG. 3. The nonvolatile memory device may a high voltage generator which generates a high voltage using an external voltage and has a plurality of pump units. The number of pump units joining in generating the high voltage may be varied according to requirements of the external device and, as previously described, in accordance with principles of inventive concepts.

N-bit data (N being 1 or more integer) processed/to be processed by the processing unit 2101 may be stored in the storage medium 2505 through the memory controller 2404. In exemplary embodiments in which the computing system is a mobile device, a battery 2606 may be further included in the computing system to supply an operating voltage thereto. Although not illustrated in FIG. 7, the computing system may further comprise an application chipset, a camera image processor (CIS), a mobile DRAM, and the like.

Figure 8:
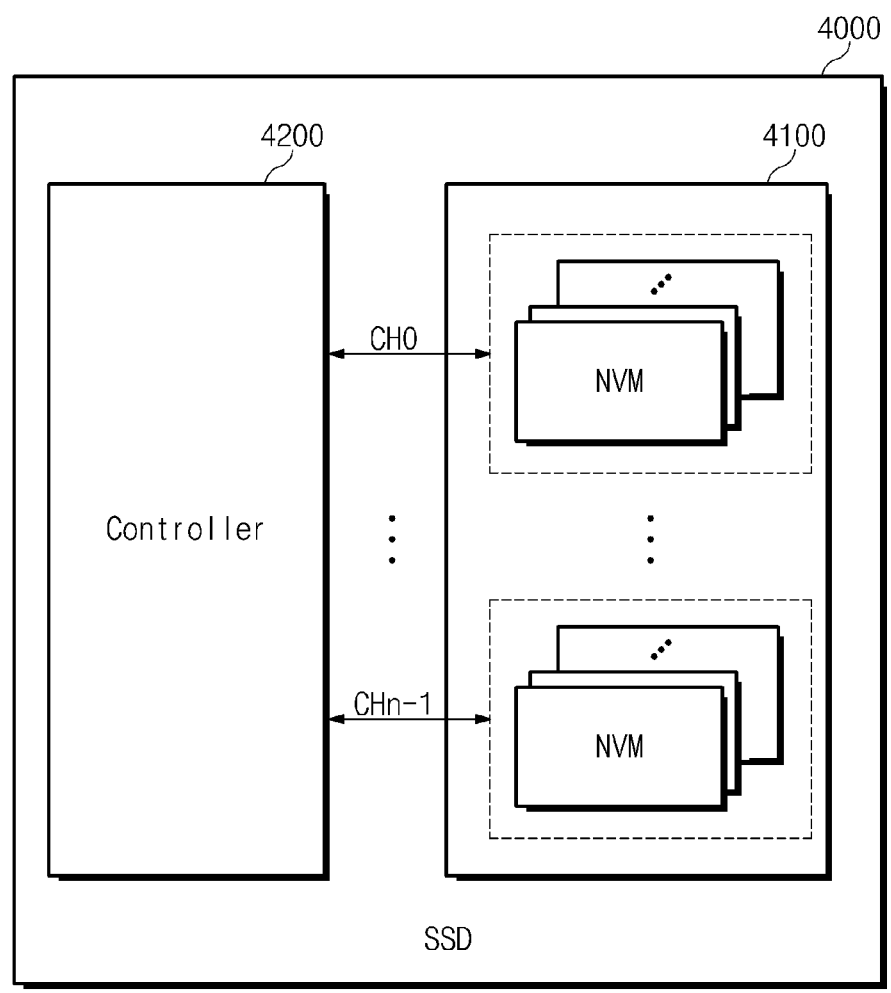
FIG. 8 is a block diagram schematically illustrating a solid state drive according to an exemplary embodiment in accordance with principles of inventive concepts.

FIG. 8 is a block diagram schematically illustrating a solid state drive according to an exemplary embodiment in accordance with principles of inventive concepts. Solid state drive (SSD) 4000 may comprise storage medium 4100 and a controller 4200. The storage medium 4100 may be connected with the controller 4200 via a plurality of channels CH0 to CHn-1, each of which is commonly connected with a plurality of nonvolatile memories. The controller 4200 may be arranged substantially the same as that described in FIG. 2, and each of nonvolatile memory devices of the storage medium 4100 may be formed of a nonvolatile memory device of FIG. 3, for example. The nonvolatile memory device may include a high voltage generator which generates a high voltage using an external voltage and which includes a plurality of pump units. The number of pump units joining in generating the high voltage may be varied according to the external device in accordance with principles of inventive concepts.

Figure 9:
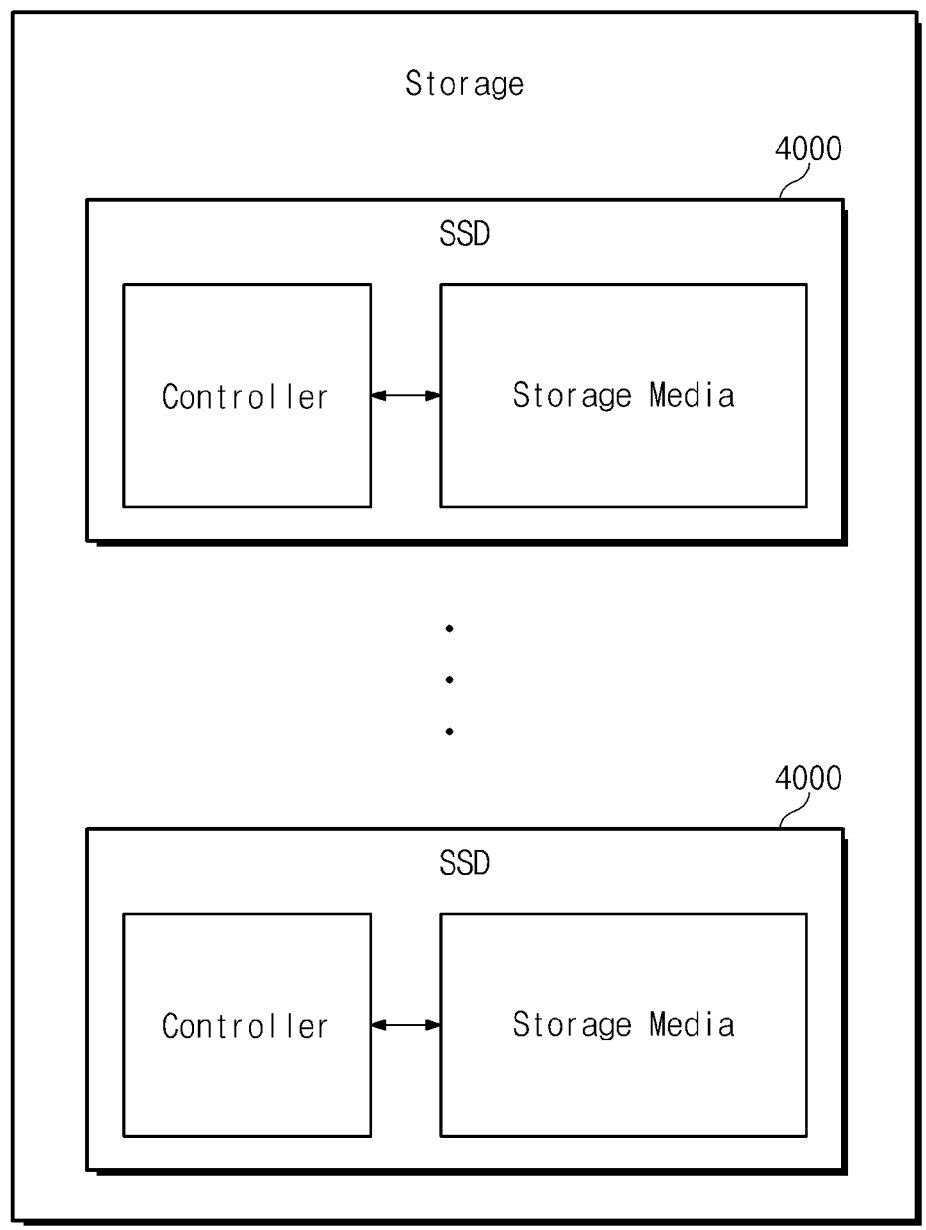
FIG. 9 is a block diagram schematically illustrating a storage using a solid state drive in FIG. 8.
Figure 10:
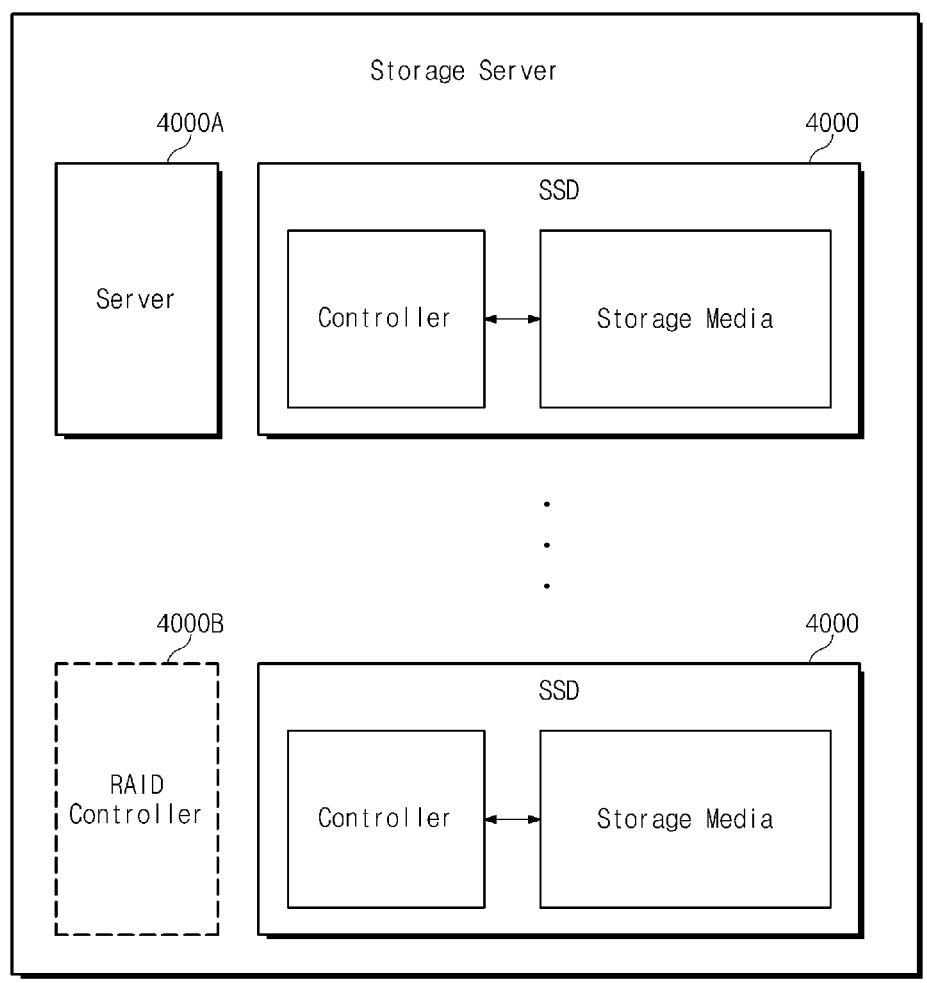
FIG. 10 is a block diagram schematically illustrating a storage server using a solid state drive in FIG. 8.

FIG. 9 is a block diagram schematically illustrating a storage using a solid state drive in FIG. 8, and FIG. 10 is a block diagram schematically illustrating a storage server using a solid state drive in FIG. 8 in accordance with principles of inventive concepts.

An SSD 4000 according to an exemplary embodiment in accordance with principles of inventive concepts may be used to form the storage. As illustrated in FIG. 9, the storage may include a plurality of solid state drives 4000 which are arranged the same as described in FIG. 8, for example. An SSD 4000 according to an embodiment of the inventive concept may be used to configure a storage sever. As illustrated in FIG. 10, a storage server includes a plurality of solid state drives 4000, which are arranged the same as described in FIG. 8, and a server 4000A. In exemplary embodiments in accordance with principles of inventive concepts RAID controller 4000B is provided in the storage server.

Figure 11:
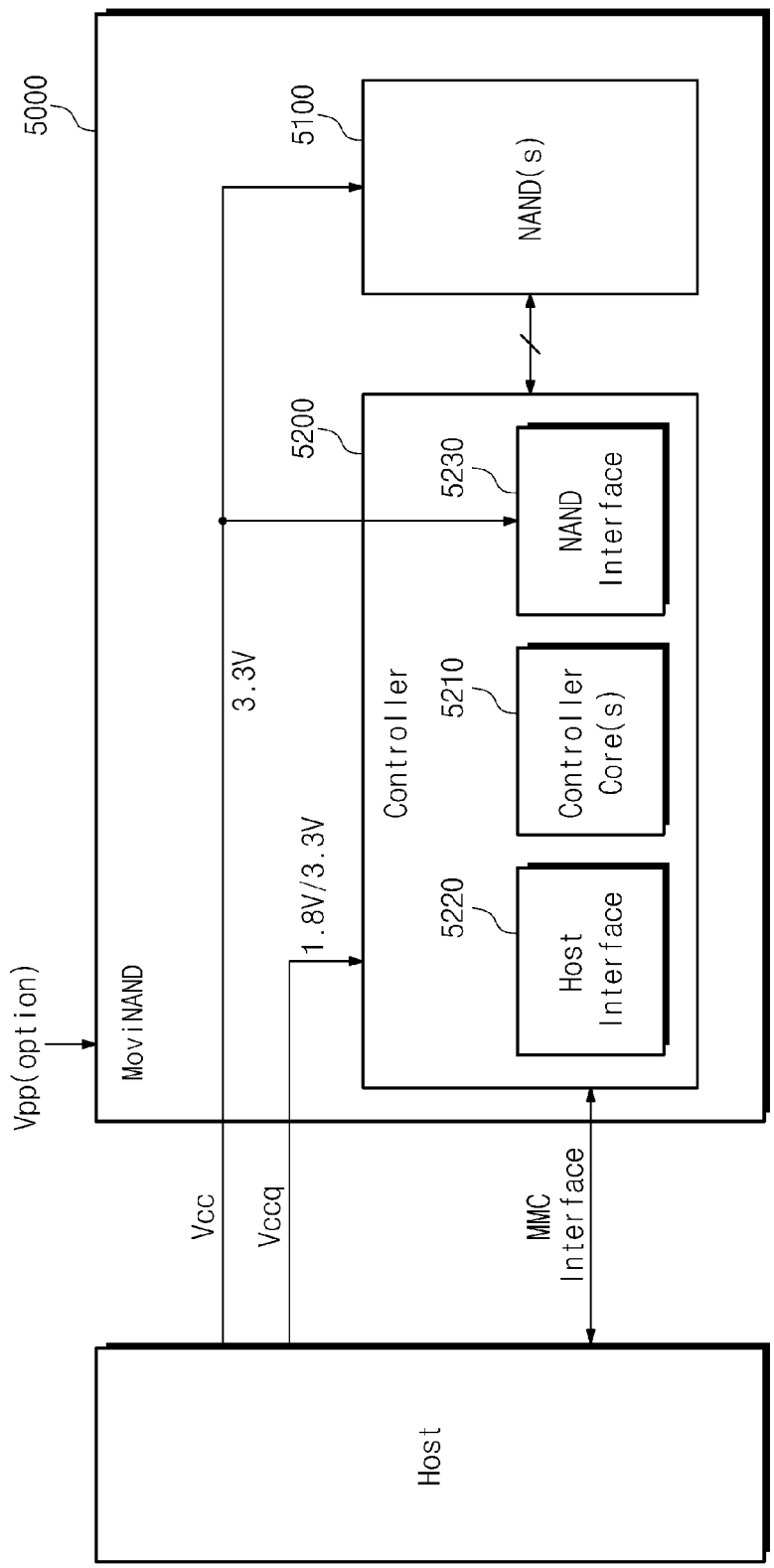
FIG. 11 is a block diagram schematically illustrating a moviNAND according to an exemplary embodiment in accordance with principles of inventive concepts.

FIG. 11 is a block diagram schematically illustrating a moviNAND according to an exemplary embodiment in accordance with principles of inventive concepts. Movi-NAND device 5000 may include at least one NAND flash memory device 5100 and a controller 5200. The moviNAND device 5000 may support the MMC 4.4 (or, referred to as "eMMC") standard.

The NAND flash memory device 5100 may be a single data rate (SDR) NAND flash memory device or a double data rate (DDR) NAND flash memory device. In exemplary embodiments in accordance with principles of inventive concepts, the NAND flash memory device 5100 may include NAND flash memory chips. The NAND flash memory device 5100 may be implemented by stacking the NAND flash memory chips at one package (for example, FBGA, Fine-pitch Ball Grid Array, etc.).

The controller 5200 may be arranged substantially the same as that described in FIG. 2, and the NAND flash memory device 5100 may be formed of a nonvolatile memory device of FIG. 3. The nonvolatile memory device may include a high voltage generator which generates a high voltage using an external voltage and has a plurality of pump units. The number of pump units joining in generating the high voltage may be varied according to the external device in accordance with principles of inventive concepts.

The controller 5200 may be connected with the NAND flash memory device 5100 via a plurality of channels. The controller 5200 may include at least one controller core 5210, a host interface 5220, and a NAND interface 5230. The controller core 5210 may control overall operation of the moviNAND device 5000. The host interface 5220 may be arranged to perform an MMC interface between the controller 5200 and a host, for example. The NAND interface 5230 may be arranged to interface between the NAND flash memory device 5100 and the controller 5200. In exemplary embodiments in accordance with principles of inventive concepts, the host interface 5220 may be a parallel interface (for example, an MMC interface). In other example embodiments, the host interface 5220 of the moviNAND device 5000 may be a serial interface (for example, UHS-II, UFS, etc.).

The moviNAND device 5000 may receive power supply voltages Vcc and Vccq from the host. Power supply voltage Vcc (for example, about 3.3V) may be supplied to the NAND flash memory device 5100 and the NAND interface 5230, while the power supply voltage Vccq (for example, about 1.8V/3.3V) may be supplied to the controller 5200. The NAND flash memory device 5100 may generate a high voltage directly using the power supply voltages Vcc as an external voltage. In exemplary embodiments in accordance with principles of inventive concepts, an external high voltage Vpp may be optionally supplied to the moviNAND device 5000. In such exemplary embodiments, a high voltage generator of the NAND flash memory device 5100 may generate a high voltage using the external high voltage Vpp.

The moviNAND device 5000 according to exemplary embodiments in accordance with principles of inventive concepts may be advantageous to store mass data as well as may have an improved read characteristic. The moviNAND device 5000 according to an embodiment of the inventive concept is applicable to small and low-power mobile products, for example.

Figure 12:
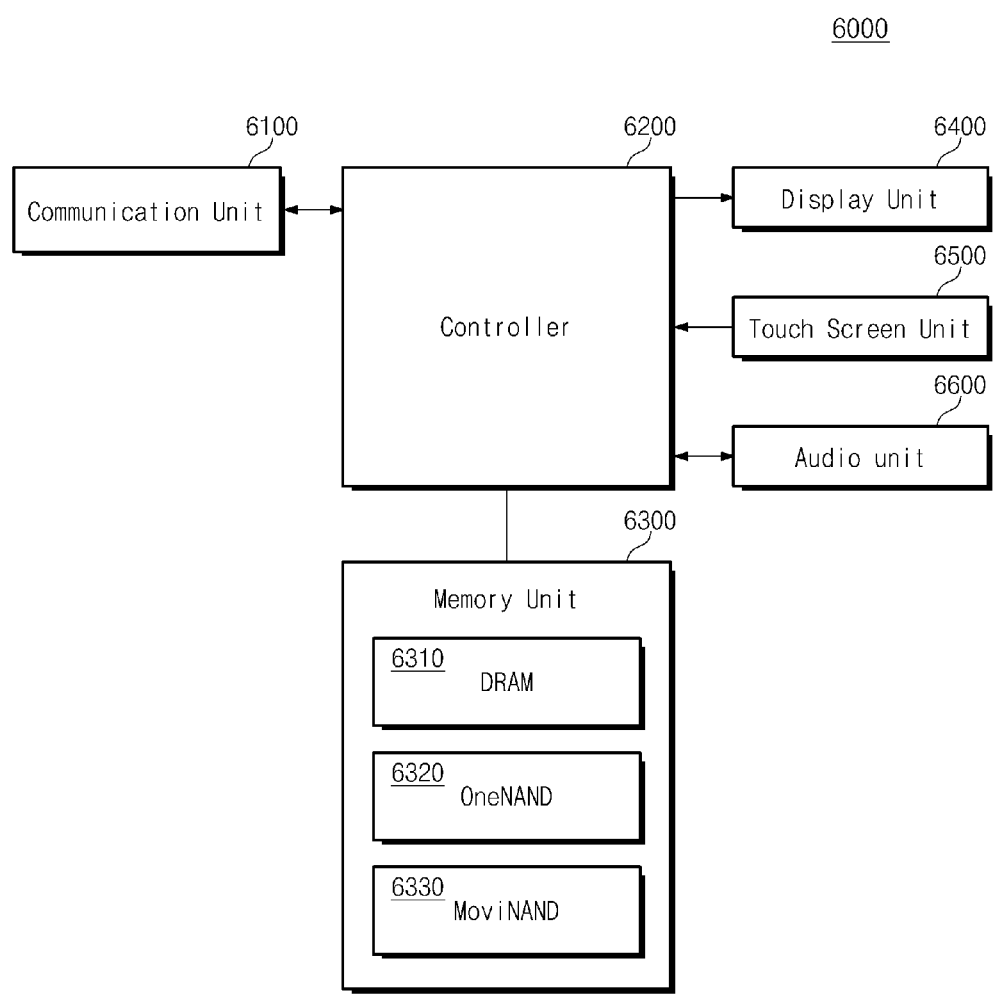
FIG. 12 is a block diagram schematically illustrating a communication device according to an exemplary embodiment in accordance with principles of inventive concepts.

FIG. 12 is a block diagram schematically illustrating a communication device according to an exemplary embodiment in accordance with principles of inventive concepts. Referring to FIG. 12, a communication device 6000 may include a communication unit 6100, a controller 6200, a memory unit 6300, a display unit 6400, a touch screen unit 6500, and an audio unit 6600. The memory unit 6300 may include at least one DRAM 6310, at least one OneNAND 6320, and at least one moviNAND 6330.

A detailed description of such a mobile device is disclosed in U.S. Patent Publication Nos. 2010/0010040, 2010/0062715, 2010/00199081, 2010/0309237 and 2010/0315325, the entire contents of which are herein incorporated by references.

Figure 13:
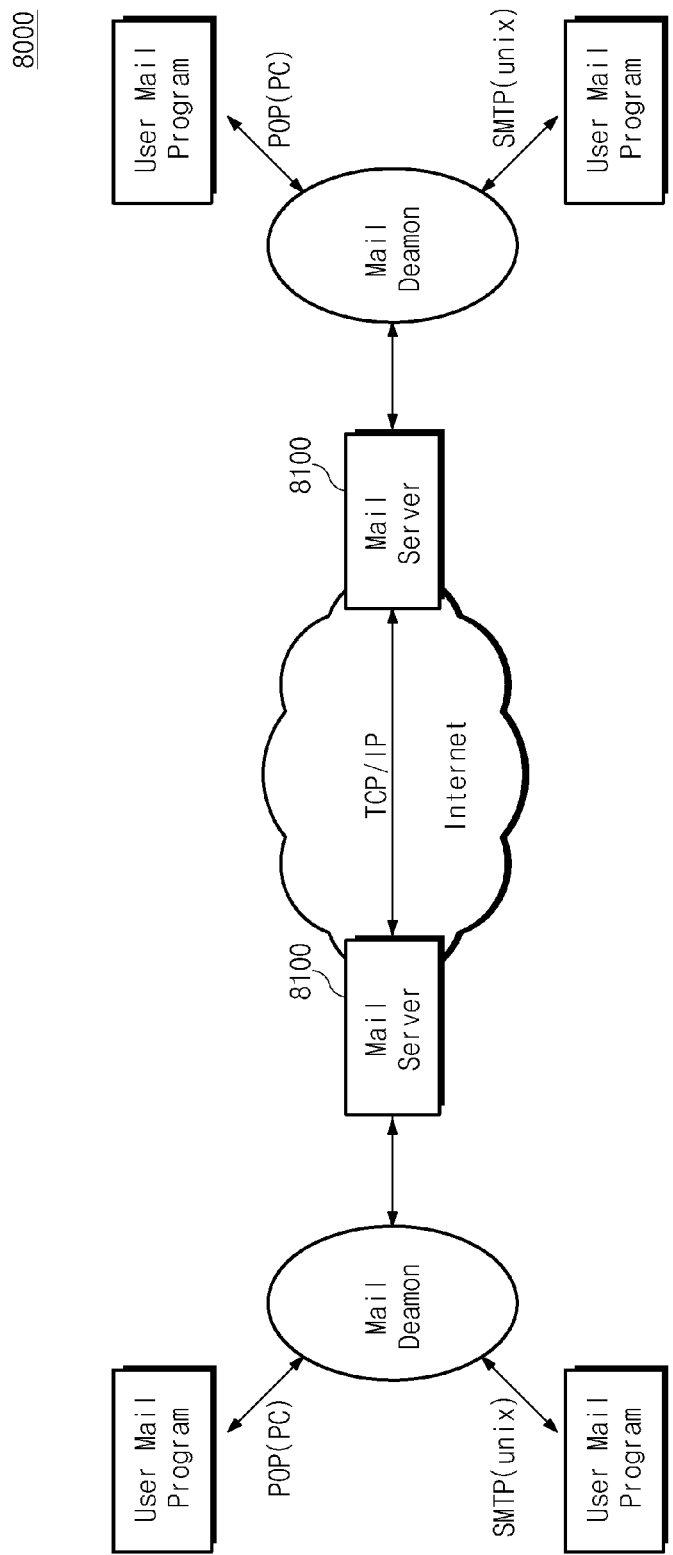
FIG. 13 is a diagram schematically illustrating systems to which a data storage device according to embodiments of the inventive concept is applied.

FIG. 13 is a diagram schematically illustrating systems to which a data storage device according to exemplary embodiments in accordance with principles of inventive concepts may be applied. Solid state drive including a data storage device according to an exemplary embodiment in accordance with principles of inventive concepts may be applied to a main server 8100, for example.

Figure 14:
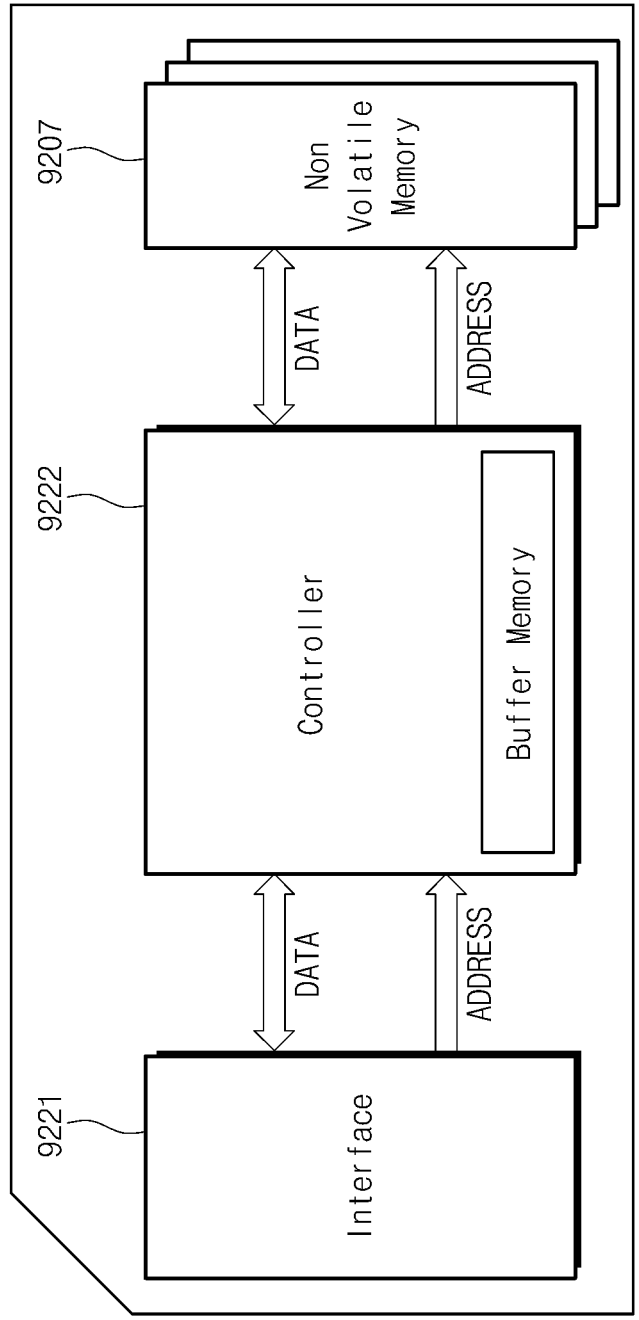
FIG. 14 is a block diagram schematically illustrating a memory card according to an exemplary embodiment in accordance with principles of inventive concepts.

FIG. 14 is a block diagram schematically illustrating a memory card according to an exemplary embodiment in accordance with principles of inventive concepts. A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 14, the memory card may include an interface circuit 9221 for interfacing with an external device, a controller 9222 including a buffer memory and controlling an operation of the memory card, and at least one nonvolatile memory device 9207. The controller 9222 may be a processor which is arranged to control write and read operations of the nonvolatile memory device 9207. The controller 9222 may be coupled with the nonvolatile memory device 9207 and the interface circuit 9221 via a data bus and an address bus. The interface circuit 9221 may interface with a host via a card protocol (for example, SD/MMC) for data exchange between a host and a memory card.

The controller 9222 may be arranged substantially the same as that described in FIG. 2, and the nonvolatile memory device 9207 may be formed of a nonvolatile memory device of FIG. 3. The nonvolatile memory device may include a high voltage generator which generates a high voltage using an external voltage and has a plurality of pump units. The number of pump units joining in generating the high voltage may be varied according to the external device in accordance with principles of inventive concepts.

Figure 15:
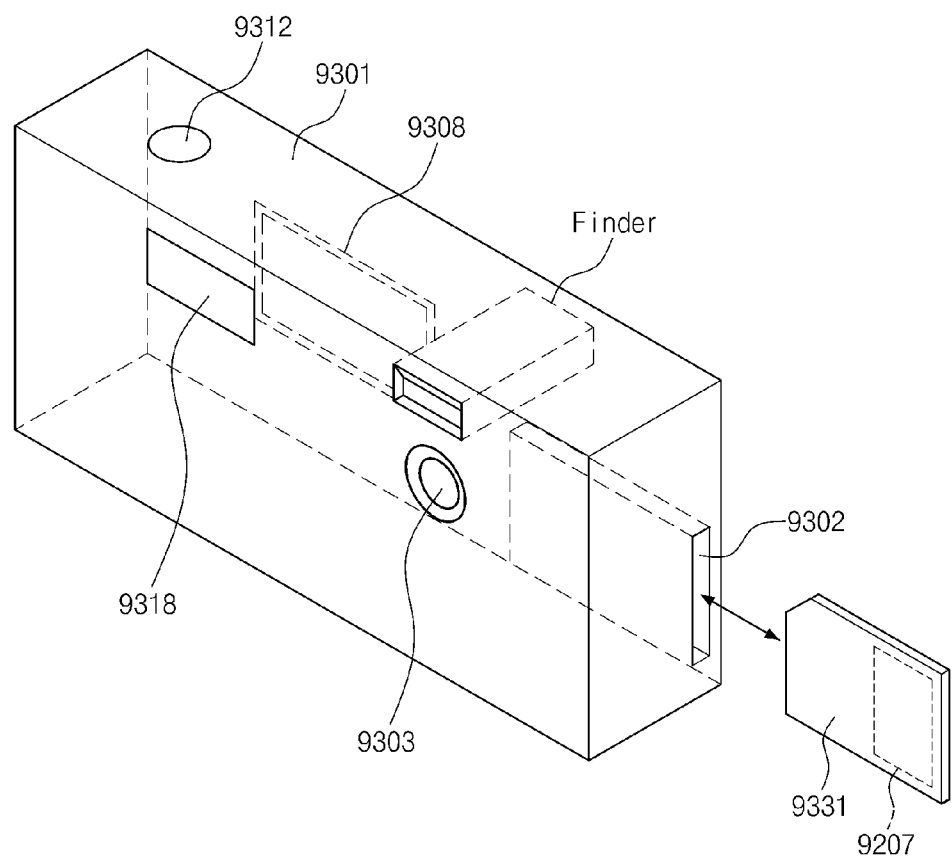
FIG. 15 is a block diagram schematically illustrating a digital still camera according to an exemplary embodiment in accordance with principles of inventive concepts.

FIG. 15 is a block diagram schematically illustrating a digital still camera according to an exemplary embodiment in accordance with principles of inventive concepts.

Digital still camera may include a body 9301, a slot 9302, a lens 9303, a display circuit 9308, a shutter button 9312, a strobe 9318, and the like. The memory card 9331 may include a memory controller and a nonvolatile memory device described in FIG. 1.

The memory controller may be arranged substantially the same as that described in FIG. 2, and the nonvolatile memory device may be formed of a nonvolatile memory device of FIG. 3. The nonvolatile memory device may include a high voltage generator which generates a high voltage using an external voltage and has a plurality of pump units. The number of pump units joining in generating the high voltage may be varied according to the external device in accordance with principles of inventive concepts.

If the memory card 9331 has a contact type, an electric circuit on a circuit board may be electrically contacted with the memory card 9331 when it is inserted in the slot 9302. In the event that the memory card 9331 has a non-contact type, an electric circuit on a circuit board may communicate with the memory card 9331 in a radio-frequency manner.

Figure 16:
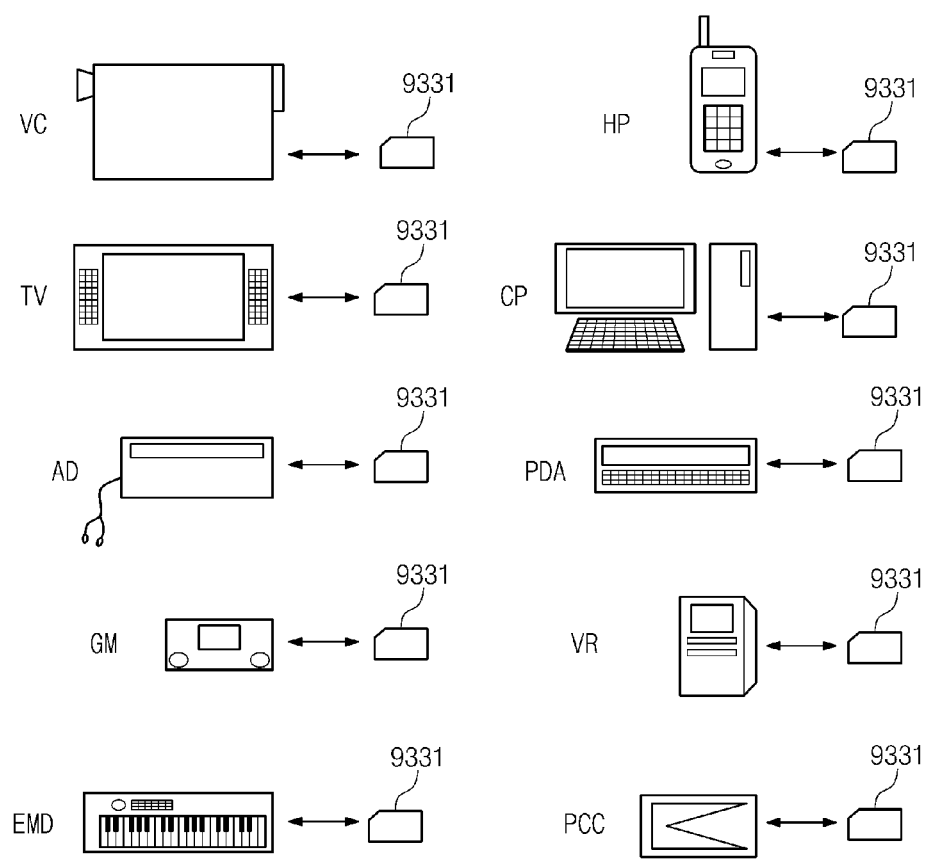
FIG. 16 is a diagram schematically illustrating various systems to which a memory card in FIG. 14 is applied.

FIG. 16 is a diagram schematically illustrating various systems to which a memory card in accordance with principles of inventive concepts such as that in FIG. 14 may be applied.

Memory card 9331 may be applied to a video camera VC, a television TV, an audio device AD, a game machine GM, an electronic music device EMD, a cellular phone HP, a computer CP, a Personal Digital Assistant (PDA), a voice recorder VR, a PC card PCC, and the like.

In exemplary embodiments in accordance with principles of inventive concepts, memory cells can be formed of a variable resistance memory cell. An exemplary variable resistance memory cell and a memory device including the same are disclosed in U.S. Pat. No. 7,529,124, the entirety of which is incorporated by reference herein.

In other exemplary embodiments in accordance with principles of inventive concepts, memory cells can be formed of one of various cell structures having a charge storage layer. Cell structures having a charge storage layer include a charge trap flash structure using a charge trap layer, a stack flash structure in which arrays are stacked at multiple layers, a source-drain free flash structure, a pin-type flash structure, and the like.

In still other example exemplary embodiments in accordance with principles of inventive concepts, a memory device having a charge trap flash structure as a charge storage layer is disclosed in U.S. Pat. No. 6,858,906 and U.S. Patent Publication Nos. 2004/0169238 and 2006/0180851, the entirety of which is incorporated by reference herein. A source-drain free flash structure is disclosed in KR Patent No. 673020, the entirety of which is incorporated by reference herein.

A flash memory device and/or a memory controller in accordance with principles of inventive concepts may be packed using various types of packages. For example, A non-volatile memory device or a memory controller according to the inventive concept may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While exemplary embodiments in accordance with principles of inventive concepts have been described, various changes and modifications may be made without departing from the spirit and scope of inventive concepts. Therefore, it should be understood that the above exemplary embodiments are not limiting, but illustrative.

What is claimed is:
1. A nonvolatile memory device, comprising:
a memory cell array; and
a high voltage generator arranged to generate a high voltage to be supplied to the memory cell array,
wherein the high voltage generator includes:

a pump unit block having a plurality of pump units supplied with an external voltage;

a voltage increment control block arranged to generate a voltage increment code varied according to a fixed clock signal generated using an internal voltage;

a regulator arranged to determine whether an output voltage of the pump unit block reaches a target level, based on the voltage increment code; and a final stage decision block arranged to generate a pump unit selection code varied according to a variable clock signal generated using the external voltage, wherein the number of pump units, used to generate the high voltage, from among the plurality of pump units is determined by the pump unit selection code.

2. The nonvolatile memory device of claim 1, wherein the regulator comprises:

a voltage divider arranged to divide an output voltage of the pump unit block according to the voltage increment code, the divided voltage being constantly varied according to the voltage increment code;

a comparator arranged to compare the divided voltage of the voltage divider and a reference voltage; and a logic gate arranged to supply a pump clock signal to the pump unit block according to the comparison result of the comparator.

3. The nonvolatile memory device of claim 2, wherein the voltage increment block comprises:

a fixed clock generator arranged to generate the fixed clock signal having a period determined according to the internal voltage; and a code generator arranged to count the fixed clock signal to generate the voltage increment code, the code generator activating a count end signal when the count value reaches a particular value.

4. The nonvolatile memory device of claim 3, wherein the final stage decision block comprises:

a variable block generator arranged to generate the variable clock signal having a period determined according to the external voltage; and a pump unit selection code generator arranged to count the variable clock signal to generate the pump unit selection code, counting of the pump unit selection code generator being terminated in response to an activation of the count end signal.

5. The nonvolatile memory device of claim 4, wherein the number of pump units, used to generate the high voltage, from among the plurality of pump units is determined by a pump unit selection code finally generated by the pump unit selection code generator at an activation of the count end signal.

6. The nonvolatile memory device of claim 5, wherein the fixed clock generator and the variable clock generator are disabled at the activation of the count end signal.

7. The nonvolatile memory device of claim 5, wherein the pump unit block comprises:

clock switches respectively corresponding to the plurality of pump units and sequentially activated by the pump unit selection code so as to supply the pump clock to corresponding pump units; and voltage switches respectively corresponding to the plurality of pump units and sequentially inactivated by the pump unit selection code so as to block the pump clock supplied to corresponding pump units.

8. The nonvolatile memory device of claim 7, wherein a voltage switch, corresponding to a final pump unit, from among the pump units is arranged to supply the external voltage to the corresponding pump unit regardless of the pump unit selection code.

9. A memory system, comprising:

a nonvolatile memory device; and a memory controller arranged to control the nonvolatile memory device, wherein the nonvolatile memory device comprises a high voltage generator including:

a pump unit block having a plurality of pump units supplied with an external voltage;

a voltage increment control block arranged to generate a voltage increment code varied according to a fixed clock signal generated using an internal voltage;

a regulator arranged to determine whether an output voltage of the pump unit block reaches a target level, based on the voltage increment code; and a final stage decision block arranged to generate a pump unit selection code varied according to a variable clock signal generated using the external voltage, wherein the number of pump units, used to generate the high voltage, from among the plurality of pump units is determined by the pump unit selection code.

10. The memory system of claim 9, wherein the external voltage is provided from the memory controller or from an external device of the memory controller.

11. A method of operating a nonvolatile memory device which includes a high voltage generator having a plurality of pump units serially connected, comprising:

generating a first clock signal having a fixed period using an internal voltage and a second clock signal having a variable period using an external voltage;

counting the second clock signal to generate a pump unit selection code for deciding the number of pump units of the high voltage generator participating in generation of a high voltage; and generating a count end signal when a count value of the first clock signal reaches a particular value, wherein counting of the second clock signal is ended by an activation of the count end signal.

12. The operating method of claim 11, wherein the number of pump units of the high voltage generator participating in generation of the high voltage is determined by a pump unit selection code finally generated at an activation of the count end signal.

13. The operating method of claim 11, wherein counting of the first clock signal and counting of the second clock signal are disabled at the activation of the count end signal.

14. The operating method of claim 11, wherein the external voltage is supplied from a memory controller controlling the nonvolatile memory device.

15. The operating method of claim 11, wherein the external voltage is supplied from the outside of a memory controller controlling the nonvolatile memory device.

16. A method of supplying a high voltage to a nonvolatile memory device, comprising:

engaging a pump from a sequentially-connected group of pumps to pump a pumping voltage to a higher level output voltage;

pumping a higher voltage output at a steady clock rate; and increasing the number of pumps engaged in pumping action until a predetermined period has elapsed, wherein the number of pumps engaged in pumping action is increased at a rate dependent upon the value of the pumping voltage.

17. The method of claim 16, wherein the number of pumps engaged in pumping action is increased at a greater rate for a lower value of pumping voltage.

18. The method of claim 17, wherein the pumps pump an output voltage for accessing a memory device.

19. The method of claim 18, wherein the pumps pump an output voltage for accessing a memory device in a portable electronic device.

\* \* \* \* \*